(12) United States Patent
Kawai

(10) Patent No.: US 10,334,733 B2
(45) Date of Patent: Jun. 25, 2019

(54) CIRCUIT STRUCTURE

(71) Applicant: OMRON CORPORATION, Kyoto-shi, Kyoto (JP)

(72) Inventor: Wakahiro Kawai, Konan (JP)

(73) Assignee: OMRON CORPORATION, Kyoto-shi (JP)

( * ) Notice: Subject to any disclaimer, the term of this patent is extended or adjusted under 35 U.S.C. 154(b) by 0 days.

(21) Appl. No.: 15/562,921

(22) PCT Filed: Mar. 22, 2016

(86) PCT No.: PCT/JP2016/058891
§ 371 (c)(1),
(2) Date: Sep. 29, 2017

(87) PCT Pub. No.: WO2016/167081
PCT Pub. Date: Oct. 20, 2016

(65) Prior Publication Data
US 2018/0092215 A1    Mar. 29, 2018

(30) Foreign Application Priority Data

Apr. 14, 2015  (JP) ................................ 2015-082806

(51) Int. Cl.
*H05K 1/18* (2006.01)
*H01L 23/12* (2006.01)
(Continued)

(52) U.S. Cl.
CPC ........... *H05K 1/185* (2013.01); *H01L 21/568* (2013.01); *H01L 23/12* (2013.01); *H01L 24/24* (2013.01);
(Continued)

(58) Field of Classification Search
USPC ................................................. 361/761, 760
See application file for complete search history.

(56) References Cited

U.S. PATENT DOCUMENTS

| | | | | |
|---|---|---|---|---|
| 2006/0054352 A1* | 3/2006 | Ryu | ....................... | H05K 1/185 174/260 |
| 2006/0286858 A1* | 12/2006 | Uchida | ................ | H01R 12/721 439/495 |

(Continued)

FOREIGN PATENT DOCUMENTS

| CN | 101946568 B | 7/2012 |
|---|---|---|
| JP | S54-102646 U | 7/1979 |

(Continued)

OTHER PUBLICATIONS

An English translation of the International Search Report of PCT/JP2016/058891 dated Jun. 14, 2016.
(Continued)

*Primary Examiner* — Andargie M Aychillhum
(74) *Attorney, Agent, or Firm* — Metrolexis Law Group, PLLC

(57) ABSTRACT

Provided is a circuit structure in which the occurrence of wiring line breakage due to deformation of a resin molded body is suppressed. A circuit structure (1) includes an electronic component (3) having an electrode (31, 32), a resin molded body (2) in which the electronic component (3) is embedded, and a wiring line (41, 42) connected to the electrode (31, 32). A groove (21) is formed around the electronic component (3) in the resin molded body (2), and the wiring line (41, 42) is provided so as to extend into the groove (21).

3 Claims, 6 Drawing Sheets

(51) Int. Cl.
  H05K 5/00  (2006.01)
  H05K 3/00  (2006.01)
  H05K 3/12  (2006.01)
  H01L 21/56  (2006.01)
  H01L 23/00  (2006.01)

(52) U.S. Cl.
  CPC ............ H01L 24/82 (2013.01); H05K 1/183 (2013.01); H05K 3/007 (2013.01); H05K 3/1258 (2013.01); H05K 5/00 (2013.01); *H01L 2224/04105* (2013.01); *H01L 2224/82102* (2013.01); *H01L 2224/82104* (2013.01); *H01L 2224/96* (2013.01); *H01L 2924/14* (2013.01); *H01L 2924/1815* (2013.01); *H01L 2924/351* (2013.01); *H05K 3/0014* (2013.01); *H05K 3/125* (2013.01); *H05K 2201/09036* (2013.01); *H05K 2201/09118* (2013.01); *H05K 2201/10636* (2013.01); *H05K 2203/0156* (2013.01); *H05K 2203/1469* (2013.01); *H05K 2203/308* (2013.01); *Y02P 70/611* (2015.11)

(56) References Cited

U.S. PATENT DOCUMENTS

| | | |
|---|---|---|
| 2008/0123308 A1 | 5/2008 | Ryu et al. |
| 2009/0085186 A1 | 4/2009 | Meyer |
| 2009/0199399 A1 | 8/2009 | Kariya et al. |
| 2011/0127656 A1 | 6/2011 | Kobayashi et al. |
| 2012/0298728 A1 | 11/2012 | Sekimoto |
| 2014/0299362 A1 | 10/2014 | Park et al. |

FOREIGN PATENT DOCUMENTS

| | | |
|---|---|---|
| JP | S59-182545 A | 10/1984 |
| JP | H07-66570 A | 3/1995 |
| JP | H8-130356 A | 5/1996 |
| JP | 2004-111502 A | 4/2004 |
| JP | 2006-086488 A | 3/2006 |
| JP | 2006-165057 A | 6/2006 |
| JP | 2010-272756 A | 12/2010 |
| JP | 2012-089568 A | 5/2012 |
| KR | 10-2010-0117975 A | 11/2010 |
| WO | 2010/140335 A1 | 12/2010 |

OTHER PUBLICATIONS

The EESR issued on Nov. 23, 2018, in a counterpart European patent application.
The office action dated Oct. 9, 2018, in a counterpart Japanese patent application.
The office action dated Feb. 11, 2019 in a counterpart Chinese patent application.

\* cited by examiner

CIRCUIT STRUCTURE

TECHNICAL FIELD

The present invention relates to a circuit structure having a resin molded body in which an electronic component is embedded.

RELATED ART

Recently, demand is on the rise for the realization of thin, light, small, and highly water-resistant wearable products of portable electronic devices, small sensors, health-care devices (electronic thermometers, sphygmomanometers, etc.), and the like at a low cost.

Typically, such electronic devices are configured by installing passive components (resistances, capacitors, etc.), active components (LSIs, ICs, etc.), power source devices (batteries, etc.), display devices (LEDs, etc.), and other electronic components (sensors, switches, etc.) on printed circuit boards. Conventionally, these printed circuit boards are produced using a method for forming a wiring circuit by etching a copper foil laminated on an epoxy resin board reinforced using glass fibers (glass epoxy board) or on a polyimide sheet (flexible printed board). Furthermore, other electronic components are mounted on the wiring circuit of these boards, using soldering, conductive adhesives, metal wires, or the like.

However, conventional printed circuit boards in which a wiring circuit is formed by etching copper foil laminated on a glass epoxy board or a flexible printed board are problematic in that costs such as material costs and processing costs increase. Furthermore, waste fluids generated during etching have significant effects on the environment. Also, mounting of electronic components using soldering, conductive adhesives, metal wires, or the like is problematic in that costs such as material costs and processing costs increase.

In order to mount a plurality of electronic components on such a printed circuit board, it is necessary to provide at least some space between the electronic components, which is problematic in that the size of the board increases. Furthermore, in order to attach a printed board to a structural section such as a resin casing, it is necessary to provide some space between the board and the structural section, which is problematic in that the thickness of the product increases and a reduction in the size of the product is limited.

As described above, in order to realize a thin and small electronic device at a low cost, it is necessary to use an electronic component assembling method where a printed circuit board as ordinarily used in conventional cases is not required.

Examples of such conventional techniques for realizing an electronic device where a printed circuit board is not required are disclosed in Patent Documents 1 to 3. The techniques disclosed in these documents will be briefly described below.

Patent Document 1: an electronic circuit package in which electronic parts, circuit elements, and the like are embedded in mold resin so as to expose an electrode surface, and a circuit is constituted with a wiring pattern formed in the mold resin.

Patent Document 2: a housing component for a portable electronic apparatus, including a housing body, electronic components in which electrodes are embedded so as to be exposed from an inner face of the housing body, and a circuit arranged on the inner face and connected to the electrodes of the electronic components.

Patent Document 3: an electronic component mounting apparatus including a housing at least a portion of which is constituted by a resin molding and an electronic component that is mounted in the housing, wherein the electronic component is embedded in the resin molding in a state where an electrode of the electronic component is exposed, and a wiring line is electrically connected to the exposed electrode.

RELATED ART DOCUMENTS

Patent Documents

Patent Document 1: JP H7-66570A (published on Mar. 10, 1995)
Patent Document 2: JP 2004-111502A (published on Apr. 8, 2004)
Patent Document 3: JP 2010-272756A (published on Dec. 2, 2010)

SUMMARY OF THE INVENTION

Problem to be Solved by the Invention

Hereinafter, problems of these conventional techniques will be described with reference to FIG. 6. FIG. 6 is a diagram illustrating problems of the conventional techniques. FIG. 6(a) shows the configuration of a conventional circuit structure 101. The circuit structure 101 includes a resin molded body 102 made of resin, an electronic component 103, and wiring lines 141 and 142. The electronic component 103 includes two electrodes 131 and 132, and is embedded in the resin molded body 102. The wiring line 141 is connected to the electrode 131, and the wiring line 142 is connected to the electrode 132. Both of the wiring lines 141 and 142 are made of metal.

FIG. 6(b) shows breakage of the wiring lines 141 and 142 that has occurred in the conventional circuit structure 101. Typically, resin and metal have different coefficients of linear expansion. When deformations 151 and 152 due to expansion or contraction as shown in FIG. 6(b) occur in the resin molded body 102, cracks 161 and 162 appear between the resin molded body 102 made of resin and the electrodes 131 and 132 made of metal. Accordingly, the wiring line 141 breaks at a portion thereof overlapping the crack 161, and the wiring line 142 breaks at a portion thereof overlapping the crack 162.

The present invention was arrived at in order to address the above-described problems. It is an object thereof to provide a circuit structure in which the occurrence of wiring line breakage caused by the deformation of a resin molded body is suppressed.

Means for Solving the Problems

In order to address the above-described problems, the present invention is directed to a circuit structure including: an electronic component having an electrode; a resin molded body in which the electronic component is embedded; and a wiring line connected to the electrode, wherein a groove is formed around the electronic component in the resin molded body, and the wiring line is provided so as to extend into the groove.

With this configuration, even when deformation due to expansion or contraction occurs in the resin molded body at a portion thereof under the wiring line, the groove deforms following that deformation. Accordingly, a force generated by the deformation of the resin molded body is dispersed by the deformation of the groove, and thus the force is prevented from being concentrated at one point in the wiring line. Accordingly, the occurrence of wiring line breakage can be suppressed.

In the circuit structure according to the present invention, it is preferable that the wiring line is provided so as to fill the groove.

With this configuration, even when deformation due to expansion or contraction occurs in the resin molded body at a portion thereof under the wiring line, the portion of the wiring line filling the groove deforms following the deformation of the resin molded body due to the malleability of the material for the wiring line. Accordingly, the occurrence of wiring line breakage caused by deformation of the resin molded body is suppressed.

In the circuit structure according to the present invention, it is preferable that a recess recessed toward a bottom of the groove is formed at a position corresponding to the groove in the wiring line.

With this configuration, the recess deforms following the deformation of the resin molded body, and thus wiring line breakage caused by deformation of the resin molded body can be further suppressed.

In the circuit structure according to the present invention, it is preferable that the circuit structure further includes at least one conductive layer between the wiring line and the electronic component in the groove.

With this configuration, the wiring line can be reliably connected via the conductive layer to the electrode even in the case where there is a problem in direct connection between the wiring line and the electrode.

In order to address the above-described problems, the present invention is further directed to a production method including: a step of forming a wetting portion around an electronic component that has an electrode, through wetting of an adhesive liquid layer when the electronic component is arranged on a sheet onto which the liquid layer has been applied; a step of allowing the wetting portion to be cured; a step of, after the wetting portion is cured, injection molding a resin material to a face of the sheet on which the electronic component is arranged; a step of forming a resin molded body in which a groove corresponding to the wetting portion is arranged around the electronic component, by removing the wetting portion together with the sheet; and a step of forming a wiring line connected to the electrode such that the wiring line extends into the groove.

With this configuration, it is possible to produce a circuit structure in which the occurrence of wiring line breakage caused by deformation of the resin molded body is suppressed.

Effects of the Invention

According to an aspect of the present invention, it is possible to provide a circuit structure in which the occurrence of wiring line breakage caused by deformation of a resin molded body is suppressed.

EMBODIMENTS OF THE INVENTION

Embodiment 1

Hereinafter, Embodiment 1 of the present invention will be described with reference to FIGS. 1 and 2.
Configuration of Circuit Structure 1

Figure 1:
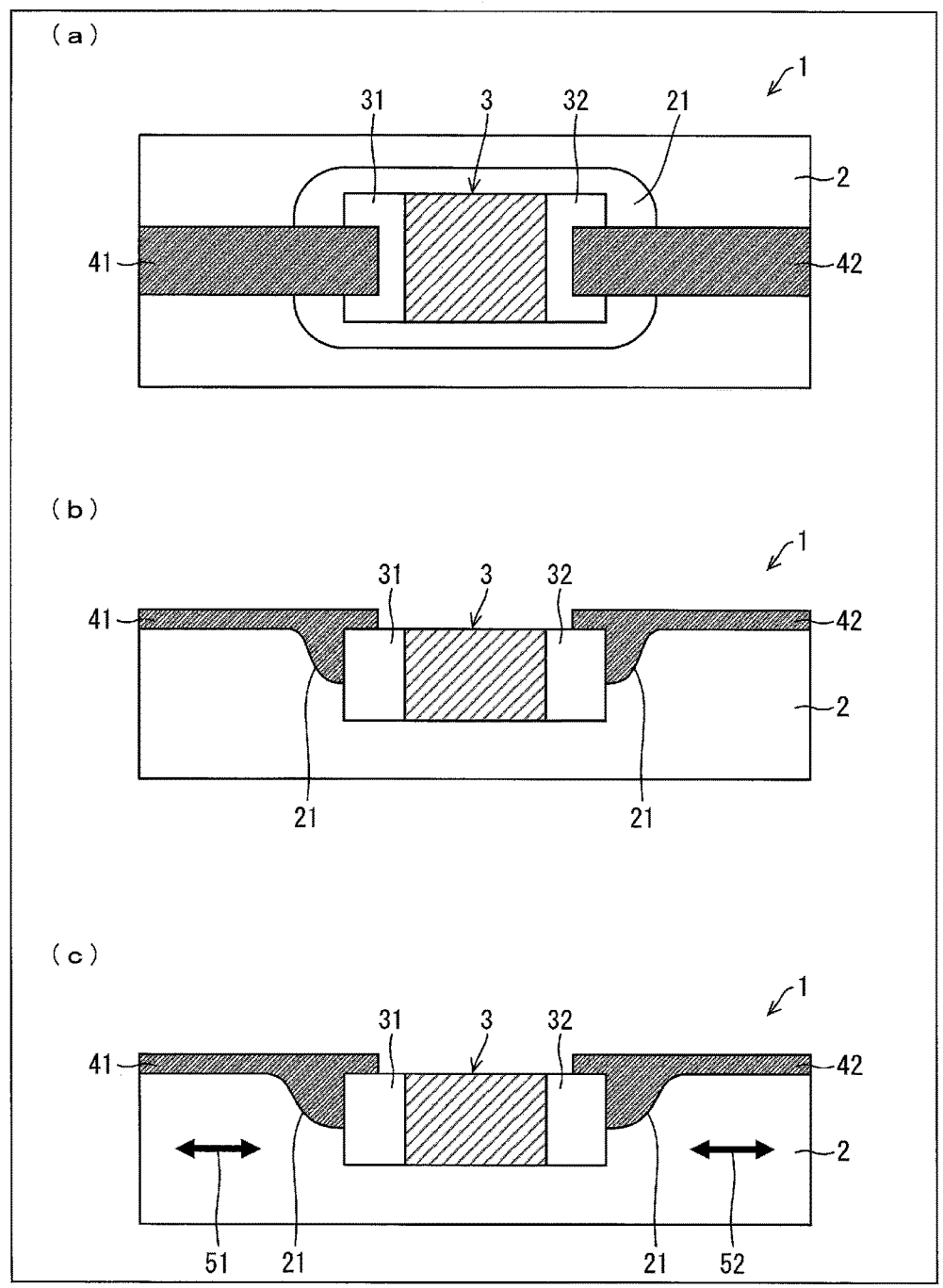
FIG. 1 is a diagram showing the main configuration of a circuit structure according to Embodiment 1 of the present invention.

FIG. 1 is a diagram showing the main configuration of a circuit structure 1 according to Embodiment 1 of the present invention. FIG. 1(a) is a top view of the circuit structure 1, and FIG. 1(b) is a side cross-sectional view of the circuit structure 1. As shown in FIG. 1(a), the circuit structure 1 includes a resin molded body 2, an electronic component 3, and wiring lines 41 and 42.

The circuit structure 1 is a portion that is to be installed on various devices such as portable electronic devices, small sensors, health-care devices (electronic thermometers, sphygmomanometers, etc.), and the like, and that performs the main or sub functions of the devices. The circuit structure 1 can incorporate a plurality of electronic components 3, and thus the size thereof can be smaller than that of a conventional circuit structure using printed wiring boards performing the same functions. Accordingly, the circuit structure 1 contributes to realizing thin, light, and small wearable products of various devices on which the circuit structure 1 is installed.

The resin molded body 2 is a resin base made of a resin material such as ABS resin (acrylonitrile-butadiene-styrene resin), and the electronic component 3 is arranged so as to be embedded in the surface of the resin molded body 2.

The electronic component 3 is a circuit element constituting one electronic circuit formed in the circuit structure 1. The electronic component 3 may be a passive component (e.g., a resistance, a capacitor, etc.) or an active component (an LSI, an IC, etc.). The electronic component 3 is embedded at a position spaced apart by a certain distance from the end portions of a face of the resin molded body 2. The electronic component 3 has a pair of electrodes 31 and 32. A groove 21 with a constant width and a constant depth is formed around the portion of the resin molded body 2 in which the electronic component 3 is embedded. The width and the depth of the groove 21 are determined as appropriate according to the type and the size of the electronic component 3 and the resin molded body 2 constituting the circuit structure 1. One face of each of the electrodes 31 and 32 is exposed from the resin molded body 2, and the exposed faces of the electrodes 31 and 32 are respectively connected to ends of the wiring lines 41 and 42.

The wiring lines 41 and 42 are formed on a face of the resin molded body 2 in which the electronic component 3 is embedded. The wiring lines 41 and 42 are conductive wiring lines made of various conductive materials (gold, silver, copper, etc.). In FIG. 1(b), the wiring line 41 is formed on the resin molded body 2 so as to fill a portion of the groove 21 facing the electrode 31. Meanwhile, the wiring line 42 is formed on the resin molded body 2 so as to fill a portion of the groove 21 facing the electrode 32.

In this embodiment, the portion of the groove 21 deeper than the position that is flush with the surface of the resin molded body 2 is filled with the material for the wiring lines 41 and 42 without a gap. That is to say, the wiring lines 41 and 42 are further formed on the resin molded body 2 without a gap between the wiring lines 41 and 42 and the surface of the groove 21 and the surface of the electrodes 31 and 32. As a result, the surfaces (exposed faces) of the wiring lines 41 and 42 are uniformly flat regardless of whether or not there is a groove 21 under the wiring lines 41 and 42. The thickness of the wiring lines 41 and 42 at a portion thereof corresponding to the groove 21 is larger than that of the wiring lines 41 and 42 at other portions thereof (portion facing the surface of the resin molded body 2 where the groove 21 is not formed).

The other ends of the wiring lines 41 and 42 are connected to electrodes of other electronic components (not shown) in the circuit structure 1. Accordingly, the electronic component 3 is electrically and functionally connected to other electronic components.

FIG. 1(c) shows the circuit structure 1 in a state where deformations 51 and 52 have occurred in the resin molded body 2. Even when the deformation 51 due to expansion or contraction occurs in the resin molded body 2 at a portion thereof under the wiring line 41 due to some reason (thermal shock, change in ambient temperature, mechanical load, etc.), the portion of the wiring line 41 filling the groove 21 deforms following the deformation 51 of the resin molded body 2 due to the malleability of the material for the wiring line 41. That is to say, the wiring line 41 has a function of absorbing a force applied by the deformation 51 in the resin molded body 2. For example, in FIG. 1(c), the deformation 51 is expansion of the resin molded body 2, which expands the width of the groove 21. At this time, the portion of the wiring line 41 filling the groove 21 expands following the expansion, and thus breakage of the wiring line 41 is suppressed. In a similar manner, when the width of the groove 21 expands due to the deformation 52, the portion of the wiring line 42 filling the groove 21 expands following the expansion, and thus the breakage of the wiring line 42 is suppressed.

Method for Producing Circuit Structure 1

Figure 2:
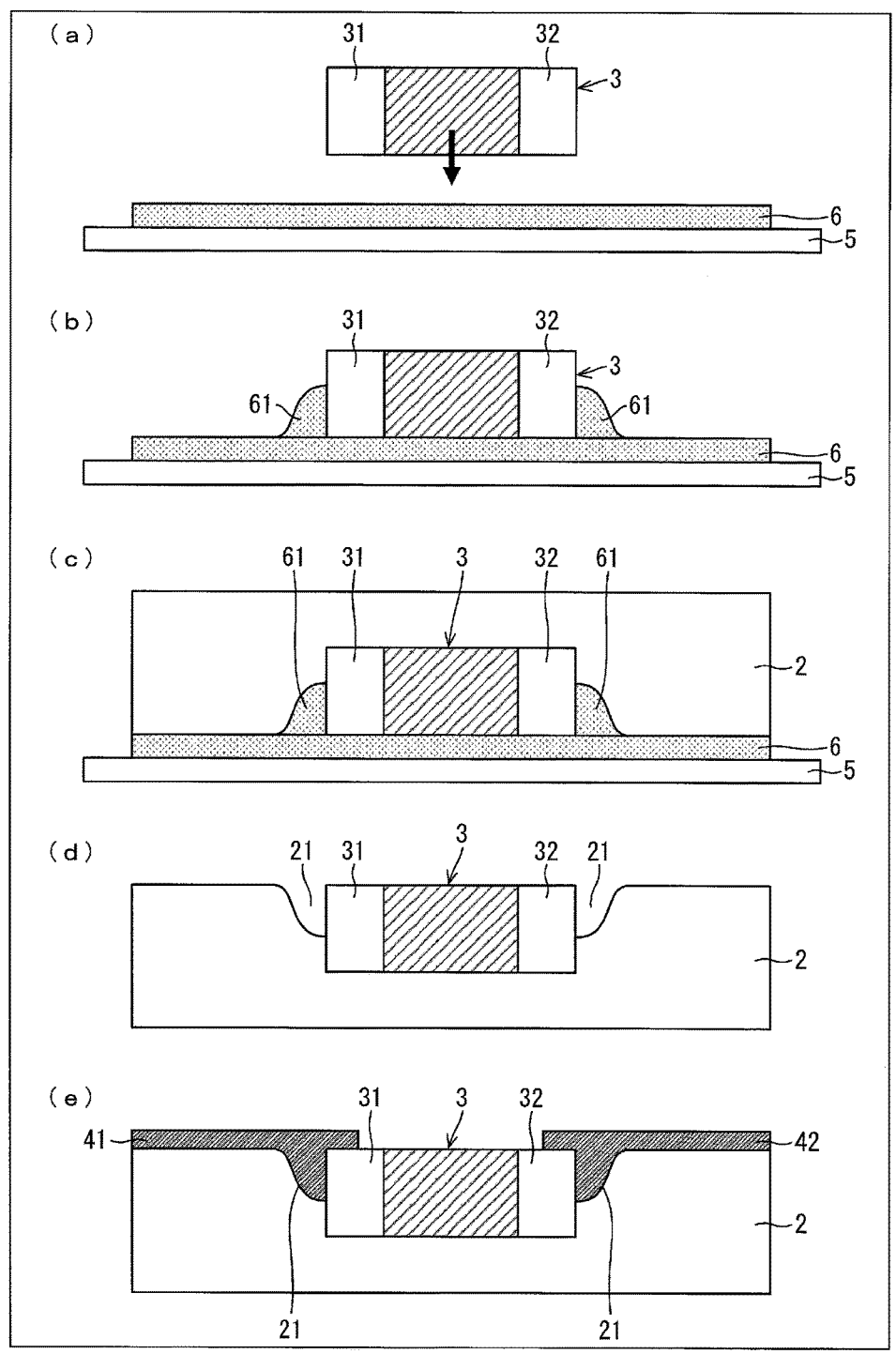
FIG. 2 is a diagram showing a method for producing the circuit structure according to Embodiment 1 of the present invention.

FIG. 2 is a diagram showing a method for producing the circuit structure 1 according to Embodiment 1 of the present invention. Hereinafter, the method for producing the circuit structure 1 will be described with reference to this drawing.

Temporary Fixing Step

As shown in FIG. 2(a), first, a sheet 5 for temporarily fixing the electronic component 3 is prepared. The material for the base material sheet of the sheet 5 is preferably a material having transparency that allows ultraviolet light to be transmitted through the material and further having flexibility that allows a later-described removing step to be reliably performed, and examples thereof include PET (polyethylene terephthalate), PEN (polyethylenenaphthalate), PPS (polyphenylene sulfide), and the like. In this embodiment, the sheet 5 is a PET sheet with a thickness of 50 μm.

An adhesive liquid layer 6 is applied to one face of the sheet 5. As the liquid layer 6, those with a short curing time are preferable, and, for example, an ultraviolet-curing adhesive may be used. An ultraviolet-curing adhesive is cured when irradiated with ultraviolet light, and thus a base material sheet and an electronic component adhere to each other. Accordingly, if the base material sheet is irradiated with ultraviolet light from the surface to which the adhesive has been applied, the electronic component itself becomes an obstacle that blocks ultraviolet light irradiation of the adhesive, which may lead to insufficient curing (adhesion). Thus, if an ultraviolet light-transmitting material is used for the base material sheet, and the base material sheet is irradiated with ultraviolet light from the surface to which the adhesive has not been applied, the adhesive can be sufficiently cured, and the electronic component can be reliably fixed to the base material sheet in a short period of time. In this embodiment, the liquid layer 6 is an ultraviolet-curing adhesive (GL-3005H manufactured by Gluelabo Ltd.) with a thickness of 2 to 3 μm.

Then, the electronic component 3 is positioned and arranged on the surface of the sheet 5 to which the liquid layer 6 has been applied. Specifically, the electronic component 3 is arranged at a position on the sheet 5 corresponding to a position spaced apart by a certain distance from the end portions of a surface of the resin molded body 2. At this time, as shown in FIG. 2(b), a wetting portion 61 is formed around the electronic component 3 as a result of the liquid layer 6 wetting the surface of the electronic component 3 due to its surface tension. After the wetting portion 61 has been formed, the sheet 5 is irradiated with ultraviolet light at 3000 mJ/cm$^2$ from the side opposite to that where the electronic component 3 is arranged. As a result, the liquid layer 6 is cured, and thus the electronic component 3 is adhesively fixed to the sheet 5. At this time, the wetting portion 61 is also cured, and the shape thereof is maintained even after the ultraviolet light irradiation. The wetting portion 61 functions as a template (mold) for forming the groove 21 in a later-described injecting step.

The shape (the width and the height) of the wetting portion 61 is determined according to the surface tension of the liquid layer 6. A wetting portion 61 with a desired height can be formed by adjusting the surface tension of the liquid layer 6. As a result, the groove 21 of the resin molded body 2 formed in the subsequent step can be formed so as to have a desired depth.

Injecting Step

After the electronic component 3 has been temporarily fixed to the sheet 5, the sheet 5 is arranged in a mold for producing the circuit structure 1. This mold is a mold for injection molding of the resin molded body 2 in which the electronic component 3 is embedded. The sheet 5 is arranged such that the surface on the side opposite to the surface of the sheet 5 to which the electronic component 3 has been temporarily fixed is in contact with the corresponding surface of the mold. The sheet 5 is arranged at a position for forming the surface of the resin molded body 2, in the mold. In this state, a resin material such as ABS resin is injected at a molding temperature of 80° C., an injected resin temperature of 180° C., and an injection pressure of 20 kg/cm$^2$. Accordingly, the electronic component 3 is embedded in the resin molded body 2.

The resin material preferably contains thermally conductive fillers in advance. Accordingly, heat generated from the electronic component 3 during the injection molding can easily escape to the outside. Examples of the thermally conductive fillers include powders of metals such as copper, powders of inorganic materials such as aluminum nitride and aluminum oxide, and the like.

Electrode Exposing Step

The sheet 5 is removed from the molded part obtained through the injection-molding, and thus the electrodes 31 and 32 of the electronic component 3 are exposed from the surface of the resin molded body 2. The wetting portion 61 formed in the temporary fixing step is removed together with the sheet 5 from the resin molded body 2. As a result, the resin molded body 2 in which the groove 21 is arranged around the electronic component 3 is formed.

Wiring Line Forming Step

Lastly, the wiring lines 41 and 42 that are to be respectively connected to the electrodes 31 and 32 exposed from the surface of the resin molded body 2 are formed on the surface. At this time, for example, a method for injecting conductive silver nanoink that is the material for the wiring lines 41 and 42 (e.g., inkjet printing) is used. When forming the wiring lines 41 and 42, the nozzle of the inkjet head moves so as to pass through a point over the groove 21. Accordingly, the wiring lines 41 and 42 are formed so as to extend into the groove 21. More specifically, the wiring lines 41 and 42 are formed so as to continuously cover the flat surface of the resin molded body 2 and the surface of the groove 21.

In this embodiment, silver nanoink is injected such that the portions of the groove 21 facing the electrodes 31 and 32 are filled with the wiring lines 41 and 42. This processing is performed by changing the injection amount of silver nanoink per unit time as appropriate according to the surface shape of the resin molded body 2. For example, the injection amount of silver nanoink per unit time to the surface of the groove 21 of the resin molded body 2 may be set to be larger than that to the flat surface of the resin molded body 2. When formation of the wiring lines 41 and 42 ends, the circuit structure 1 in which the electronic component 3 is embedded is complete. Note that, instead of inkjet printing, screen printing or silver plating also may be used.

With the production method described above, it is possible to produce the circuit structure 1 in which the breakage of the wiring lines 41 and 42 due to deformation of the resin molded body 2 is suppressed.

Embodiment 2

Hereinafter, Embodiment 2 of the present invention will be described with reference to FIGS. 3 and 4. Note that the same constituent elements as those in Embodiment 1 are denoted by the same reference numerals, and a description thereof has been omitted.

Configuration of Circuit Structure 1a

Figure 3:
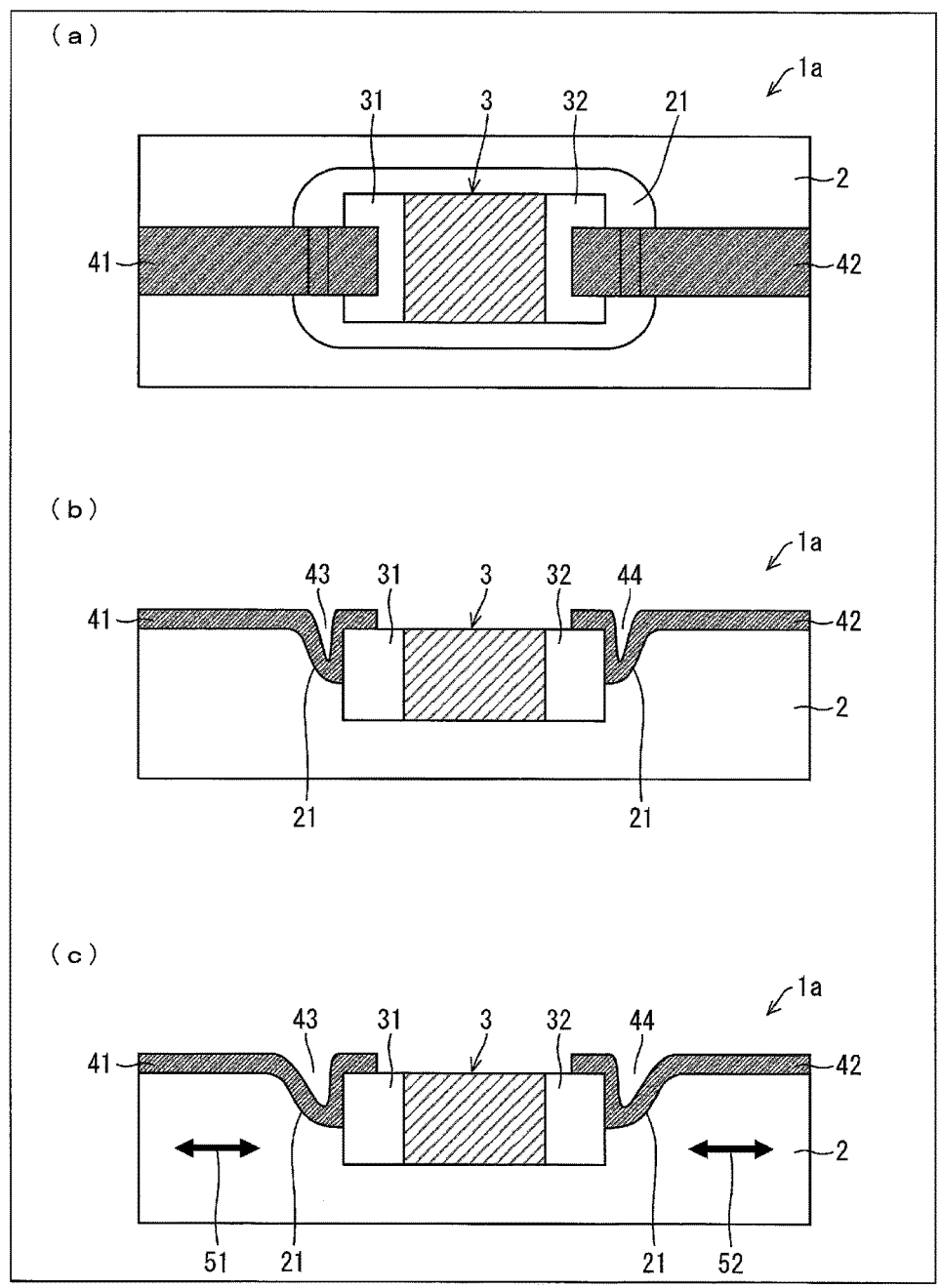
FIG. 3 is a diagram showing the main configuration of a circuit structure according to Embodiment 2 of the present invention.

FIG. 3 is a diagram showing the main configuration of a circuit structure 1a according to Embodiment 2 of the present invention. FIG. 3(a) is a top view of the circuit structure 1a, and FIG. 3(b) is a side cross-sectional view of the circuit structure 1a. As shown in FIG. 3(a), the circuit structure 1a includes the resin molded body 2, the electronic component 3, and the wiring lines 41 and 42, as in the circuit structure 1 according to Embodiment 1 of the present invention. However, the circuit structure 1a according to this embodiment is different from the circuit structure 1 according to Embodiment 1, in that recesses 43 and 44 are respectively formed in the wiring lines 41 and 42.

As shown in FIG. 3(b), the recess 43 having a constant depth is formed in the portion of the wiring line 41 filling the groove 21. Furthermore, the recess 44 having a constant depth is formed in the portion of the wiring line 42 filling the groove 21. In this manner, the exposed surfaces of the wiring lines 41 and 42 are not uniformly flat, and have a shape that is recessed toward the bottom of the resin molded body 2 at portions where the recesses 43 and 44 are formed. The recesses 43 and 44 may be referred to as other grooves that are formed at positions corresponding to the groove 21 in the wiring lines 41 and 42.

FIG. 3(c) shows the circuit structure 1a in a state where deformations 51 and 52 have occurred in the resin molded body 2. Even when the deformation 51 due to expansion or contraction occurs in the resin molded body 2 at a portion thereof under the wiring line 41, the portion of the wiring line 41 filling the groove 21 deforms as described in Embodiment 1, and, furthermore, the recess 43 formed in that portion also deforms following the deformation 51 of the resin molded body 2. For example, in FIG. 1(c), the deformation 51 is due to expansion of the resin molded body 2, which expands the width of the groove 21. At this time, both the portion of the wiring line 41 filling the groove 21 and the recess 43 formed in that portion expand following the expansion, and thus the breakage of the wiring line 41 can be suppressed more than in Embodiment 1. In a similar manner, when the width of the groove 21 expands due to the deformation 52, the portion of the wiring line 42 filling the groove 21 and the recess 44 formed in that portion expand following the expansion, and thus the breakage of the wiring line 42 can be suppressed more than in Embodiment 1.

Method for Producing Circuit Structure 1a

Figure 4:
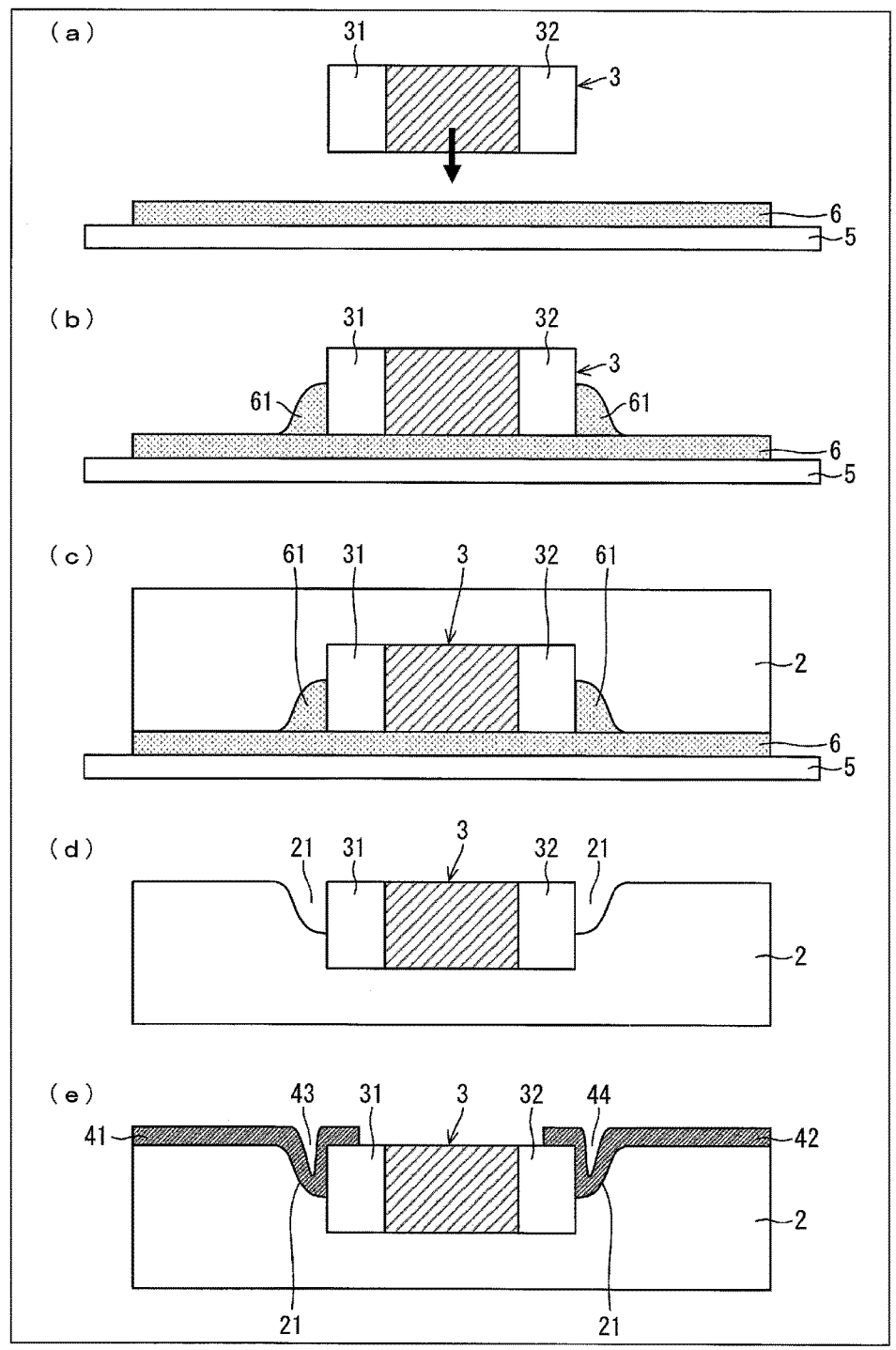
FIG. 4 is a diagram showing a method for producing the circuit structure according to Embodiment 2 of the present invention.

FIG. 4 is a diagram showing a method for producing the circuit structure 1a according to Embodiment 2 of the present invention. Hereinafter, the method for producing the circuit structure 1a will be described with reference to this drawing.

The temporary fixing step, the injecting step, and the electrode exposing step in this embodiment are as in Embodiment 1, and thus a detailed description thereof has been omitted. The wiring line forming step is partially different from that in Embodiment 1. In this embodiment, in the wiring line forming step, silver nanoink is injected such that the recesses 43 and 44 are formed in the portions of the wiring lines 41 and 42 filling the groove 21. This processing is performed, for example, by making the injection amount of silver nanoink per unit time constant regardless of the surface shape of the resin molded body 2. For example, the injection amount of silver nanoink per unit time to the surface of the groove 21 of the resin molded body 2 may be set to be equal to the injection amount of silver nanoink per unit time to the flat surface of the resin molded body 2. Accordingly, the wiring lines 41 and 42 with a uniform thickness are continuously formed from the flat surface of the resin molded body 2 to the curved surface where the groove 21 is formed. As a result, the recesses 43 and 44 are formed along the curved shape of the portions of the resin molded body 2 where the groove 21 is formed.

The shape (the width and the depth) of the recesses 43 and 44 can be adjusted by adjusting the shape of the wetting portion 61 (by adjusting the wetting amount) in the temporary fixing step. Moreover, the shape can be adjusted also by adjusting the amount of silver nanoink that is to be applied in the wiring line forming step.

Embodiment 3

Hereinafter, Embodiment 3 of the present invention will be described with reference to FIG. 5. Note that the same constituent elements as those in Embodiment 1 or 2 are denoted by the same reference numerals, and a description thereof has been omitted.

Configuration of Circuit Structure 1b

Figure 5:
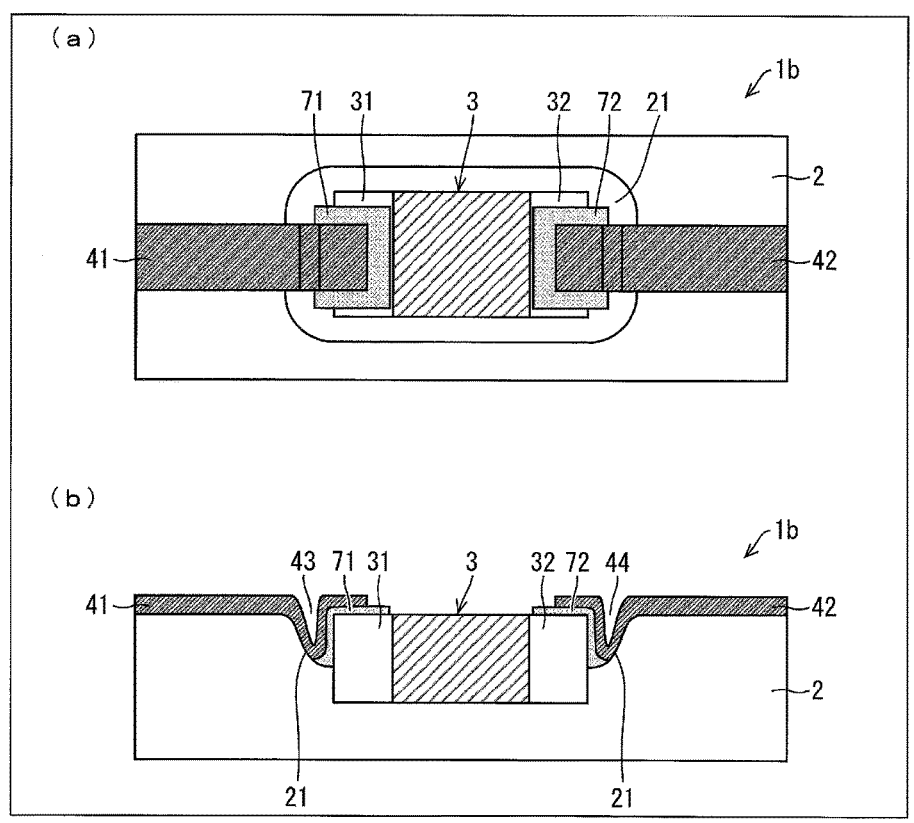
FIG. 5 is a diagram showing the main configuration of a circuit structure according to Embodiment 3 of the present invention.
Figure 6:
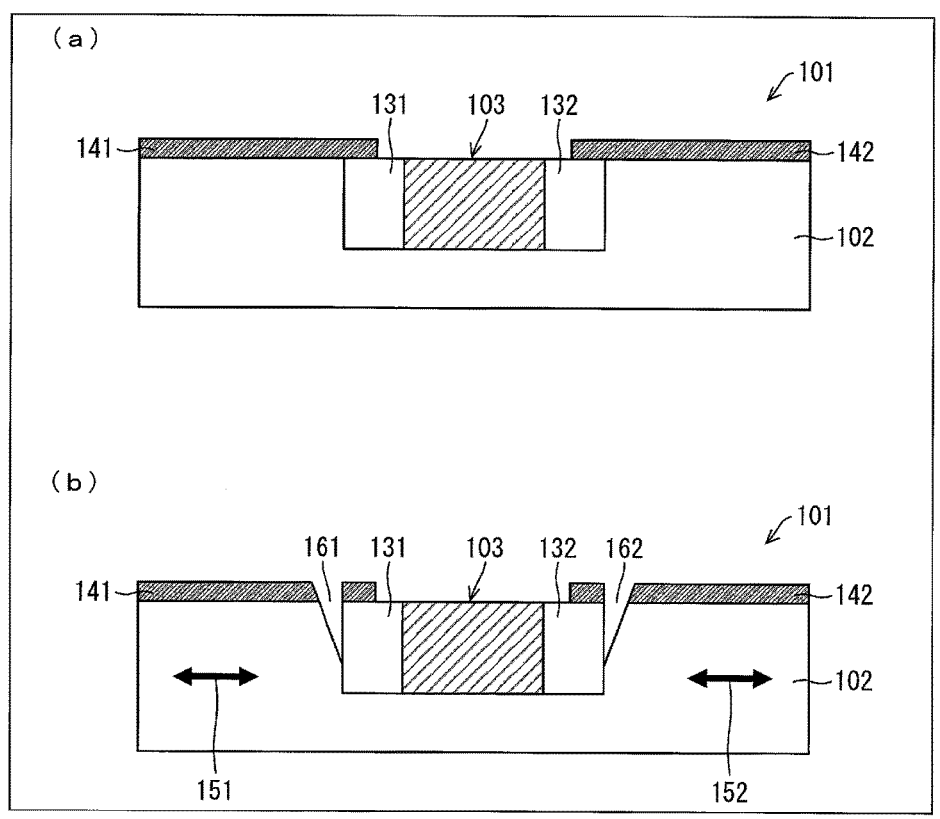
FIG. 6 is a diagram illustrating problems of conventional techniques.

FIG. 5 is a diagram showing the main configuration of a circuit structure 1b according to Embodiment 3 of the present invention. FIG. 5(a) is a top view of the circuit structure 1b, and FIG. 5(b) is a side cross-sectional view of the circuit structure 1b. As shown in FIG. 5(a), the circuit structure 1b includes the resin molded body 2, the electronic component 3, and the wiring lines 41 and 42, as in the circuit structure 1a according to Embodiment 2 of the present invention. Furthermore, as shown in FIG. 5(b), also in the circuit structure 1b according to this embodiment, the recesses 43 and 44 are respectively formed in the wiring lines 41 and 42 as in the circuit structure 1a according to Embodiment 2. However, the circuit structure 1b according to this embodiment is different from the circuit structure 1a according to Embodiment 2, in that additional conductive layers 71 and 72 are further included.

As shown in FIG. 5(b), the conductive layer 71 is formed between the wiring line 41 and the electrode 31. Meanwhile, the conductive layer 72 is formed between the wiring line 42 and the electrode 32. Accordingly, the wiring line 41 is not in direct contact with the electrode 31, and the wiring line 42 is not in direct contact with the electrode 32. The wiring lines 41 and 42 are formed so as to continuously cover the exposed surfaces and the surfaces facing the groove 21 of the electrodes 31 and 32. In this embodiment, the conductive layers 71 and 72 are formed so as to reach the bottom of the groove 21, but there is no limitation to this.

After the conductive layers 71 and 72 are formed, the wiring lines 41 and 42 are formed. The conductive layers 71 and 72 can be formed using the same method as that for forming the wiring lines 41 and 42. For example, if the wiring lines 41 and 42 are formed using the inkjet method, the conductive layers 71 and 72 are also formed using the inkjet method. Accordingly, it is not necessary to use another method for forming the conductive layers 71 and 72, and thus the costs involved in producing the circuit structure 1b can be further reduced.

The material for the conductive layers 71 and 72 may be any material as long as it is conductive. An optimal material may be selected and used for forming the conductive layers 71 and 72, according to the shape, size, or material type of other constituent elements of the circuit structure 1b. For example, there are many materials that can be used for forming the conductive layers 71 and 72, as described below.

(1) If there is a risk of the wiring lines 41 and 42 breaking at the bottom of the groove 21 during the formation thereof due to an insufficient supply of the material for the wiring lines 41 and 42 (silver nanoink, etc.) in the case where the groove 21 is deep, the conductive layers 71 and 72 may be produced using the same material as that for the wiring lines 41 and 42. Accordingly, even when the wiring lines 41 and 42 break at the bottom of the groove 21 during formation of the wiring lines 41 and 42, the wiring lines 41 and 42 can be connected to the electrodes 31 and 32 via the conductive layers 71 and 72 formed in advance.

(2) If there is a risk of insufficient joining between the wiring lines 41 and 42 and the electrodes 31 and 32 due to poor wettability of the material for the wiring lines 41 and 42 with respect to the electrodes 31 and 32, the material for the conductive layers 71 and 72 may be a material (alcohol-based material, water-based material, etc.) that has properties different from those of the material for the wiring lines 41 and 42. Accordingly, the issue of insufficient joining can be solved.

(3) If there is a risk of an increase in the connection resistance between the material for the wiring lines 41 and 42 and the material for the electrodes 31 and 32 due to galvanic corrosion or the like, the material for the conductive layers 71 and 72 may be a material that can suppress such an increase. For example, if the wiring lines 41 and 42 is made of silver nanoink and the electronic component 3 is made of tin, the material for the conductive layers 71 and 72 may be copper. Accordingly, an increase in the connection resistance can be suppressed.

In addition to the conductive layers 71 and 72, another conductive layer may be further formed in the groove. For example, on the electrode 31, a conductive layer 71 made of gold may be formed, on which another conductive layer made of silver may be formed, on which the wiring line 41 may be further formed. In this manner, it is sufficient that at least one conductive layer is formed between the wiring lines 41 and 42 and the electrodes 31 and 32.

It is preferable that, after the wiring lines 41 and 42 are formed, a protective resist (not shown) is formed on the face of the resin molded body 2 where the electronic component 3 is embedded, so as to cover at least the wiring lines 41 and 42 and the conductive layers 71 and 72. Accordingly, at least the wiring lines 41 and 42 and the conductive layers 71 and 72 are shielded from the external environment, and thus the wiring lines 41 and 42 and the conductive layers 71 and 72 can be protected from external harmful factors (water, moisture, etc.).

The present invention is not limited to the abovementioned embodiments, and various modifications can be made within the scope described in the claims. Embodiments that are obtained by appropriately combining the technical means disclosed in the different embodiments are included in the technical scope of the present invention. Furthermore, a new technical feature may be formed by combining the technical means disclosed in the embodiments.

INDUSTRIAL APPLICABILITY

The present invention can be preferably used as circuit structures installed on various devices such as portable electronic devices, small sensors, health-care devices (electronic thermometers, sphygmomanometers, etc.), and the like.

INDEX TO THE REFERENCE NUMERALS 1, 1a, 1b Circuit structure
2 Resin molded body
3 Electronic component
5 Sheet
6 Liquid layer
31, 32 Electrode
41, 42 Wiring line
71, 72 Conductive layer

The invention claimed is:

1. A circuit structure comprising: an electronic component having an electrode; a resin molded body in which the electronic component is embedded; and a wiring line connected to the electrode, and at least one conductive layer,
   wherein a groove is formed around the electronic component in the resin molded body, and the wiring line is provided so as to extend into the groove, and
   the at least one conductive layer is interposed between the wiring line and the electronic component in the groove such that the wiring line, the at least one conductive layer, and the electronic component are laminated.

2. The circuit structure according to claim 1, wherein the wiring line is provided so as to fill the groove.

3. The circuit structure according to claim 1, wherein a recess recessed toward a bottom of the groove is formed at a position corresponding to the groove in the wiring line.

\* \* \* \* \*